(12) United States Patent
Majhi et al.

(10) Patent No.: US 12,564,030 B2
(45) Date of Patent: Feb. 24, 2026

(54) REPLACEMENT CONDUCTIVE MATERIAL FOR INTERCONNECT FEATURES

(71) Applicant: Intel Corporation, Santa Clara, CA (US)

(72) Inventors: Prashant Majhi, San Jose, CA (US); Anand Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 832 days.

(21) Appl. No.: 17/530,658

(22) Filed: Nov. 19, 2021

(65) Prior Publication Data

US 2023/0163024 A1 May 25, 2023

(51) Int. Cl.
*H01L 21/768* (2006.01)
*H01L 23/522* (2006.01)
*H01L 23/528* (2006.01)
*H01L 23/532* (2006.01)

(52) U.S. Cl.
CPC .. *H01L 21/76808* (2013.01); *H01L 21/76877* (2013.01); *H01L 23/5226* (2013.01); *H01L 23/5283* (2013.01); *H01L 23/53295* (2013.01); *H01L 21/76843* (2013.01); *H01L 21/76846* (2013.01); *H01L 21/76873* (2013.01); *H01L 2221/1036* (2013.01)

(58) Field of Classification Search
CPC ......... H01L 21/76808; H01L 21/76877; H01L 21/76843; H01L 21/76846; H01L 21/76873; H01L 21/76816; H01L 21/76897; H01L 23/5226; H01L 23/5283; H01L 23/53295
See application file for complete search history.

(56) References Cited

U.S. PATENT DOCUMENTS

| | | | | | |
|---|---|---|---|---|---|
| 2004/0198055 | A1* | 10/2004 | Wang | ................ | H01L 21/76808 |
| | | | | | 438/692 |
| 2012/0326313 | A1* | 12/2012 | Uzoh | ................ | H01L 23/53209 |
| | | | | | 438/622 |
| 2015/0262912 | A1* | 9/2015 | Ting | ................. | H01L 21/76807 |
| | | | | | 438/666 |
| 2018/0294225 | A1* | 10/2018 | Lee | ........................ | H10B 43/40 |
| 2019/0181020 | A1 | 6/2019 | Jeon et al. | | |

(Continued)

OTHER PUBLICATIONS

Extended European Search Report received for EP Application No. 22201694.1 dated Apr. 19, 2023. 9 pages.

(Continued)

*Primary Examiner* — Syed I Gheyas
(74) *Attorney, Agent, or Firm* — Arcane Law PLLC

(57) ABSTRACT

An integrated circuit structure includes a first interconnect layer including a first dielectric material. The first dielectric material has a first recess therein, the first recess having a first opening. The integrated circuit structure further includes a second interconnect layer above the first interconnect layer. The second interconnect layer includes a second dielectric material that has a second recess therein. The second recess has a second opening. In an example, at least a portion of the first opening of the first recess abuts and overlaps with at least a portion of the second opening of the second recess. In an example, a continuous conformal layer is on walls of the first and second recesses, and a continuous body of conductive material is within the first and second recesses.

20 Claims, 7 Drawing Sheets

(56)          References Cited

U.S. PATENT DOCUMENTS

| | | |
|---|---|---|
| 2020/0135634 A1 | 4/2020 | Chiang et al. |
| 2020/0219813 A1 | 7/2020 | Paul et al. |
| 2020/0294998 A1 | 9/2020 | Lilak et al. |
| 2021/0296156 A1 | 9/2021 | Leobandung |
| 2023/0197613 A1 | 6/2023 | Majhi et al. |

OTHER PUBLICATIONS

Extended European Search Report received for EP Application No. 22213221.9, dated Mar. 9, 2023. 7 pages.

* cited by examiner

Only structures 112, 116

REPLACEMENT CONDUCTIVE MATERIAL FOR INTERCONNECT FEATURES

BACKGROUND

Fabrication of microelectronic devices involves forming electronic components on microelectronic substrates, such as silicon wafers. These electronic components may include transistors, resistors, capacitors, and other active and passive devices, with overlying interconnect layers. Each interconnect layer includes dielectric material (e.g., silicon dioxide) and one or more conductive interconnect features (e.g., vias and lines) each within a corresponding recess with that dielectric material. A liner including (e.g., tantalum or titanium) is conformally deposited on the walls of each recess to provide a barrier layer, so that the conductive material (e.g., copper) doesn't migrate into the dielectric material of a given layer. Scaling of microelectronic devices is increasingly dependent on scaling of these interconnect features. However, non-trivial issues remain with respect to scaling interconnect features without incurring performance degradation.

Figures 1A, 1B, 1C, 1D:
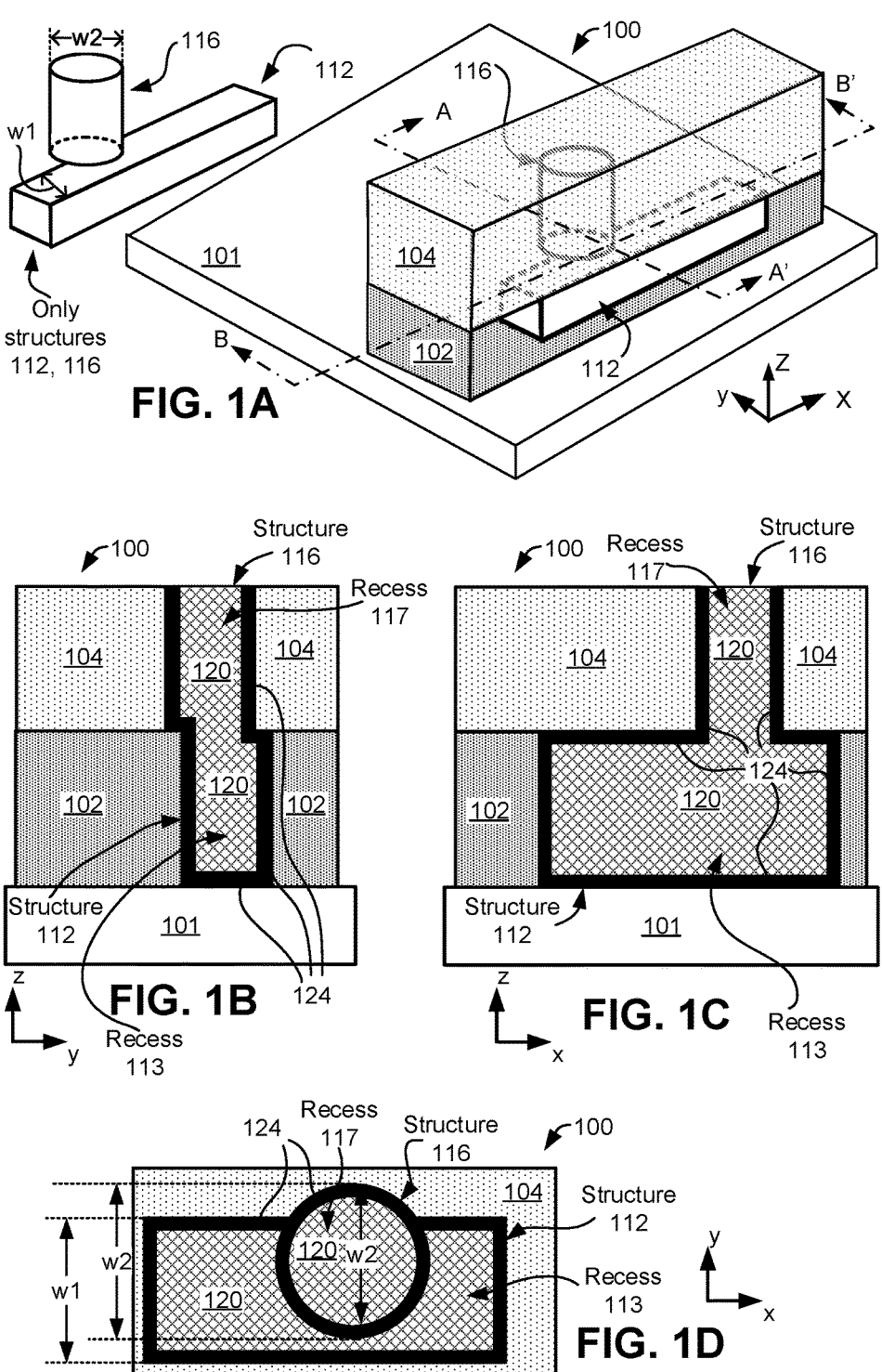
FIGS. 1A, 1B, 1C, and 1D illustrate various views of an integrated circuit device 100 comprising a first interconnect feature coupled to a second interconnect feature, where the first interconnect feature and the second interconnect feature comprise a continuous body of conductive material that extends from one interconnect layer to the next interconnect layer, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles (e.g., curved or tapered sidewalls and round corners), and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

An integrated circuit structure including relatively low-resistance interconnect features is provided herein. In one embodiment, an integrated circuit structure comprises (i) a first interconnect layer comprising a first dielectric material, and (ii) a second interconnect layer above the first interconnect layer and comprising a second dielectric material. The first dielectric material has a first recess therein, the first recess having a first opening. The second dielectric material has a second recess therein, the second recess having a second opening. At least a portion of the first opening of the first recess abuts and overlaps with at least a portion of the second opening of the second recess. In an example, a continuous and conformal barrier layer (e.g., cobalt, tantalum, titanium, or a nitride of these) is on walls of the first and second recesses. In addition, a continuous body of conductive material is within the first and second recesses. Note that the continuous body of conductive material is monolithic, and lacks a seam or barrier layer between a first section of conductive material within the first recess and a second section of conductive material within the second recess. Although a barrier layer is used in this example, the techniques provided herein can be used in conjunction with other such intervening layers, whether they be liner layers, encapsulation layers, resistance reducing layers, or some other layer that would cause an interface or discontinuation between the first and second sections of the conductive material within the first and second recesses.

In another one embodiment, a semiconductor device comprises a first recess within a first dielectric layer and a second recess within a second dielectric layer. In an example, the second recess at least in part lands on the first recess. In an example, a conformal continuous layer lines (i) sidewalls, at least a part of the top surface (e.g., sections of the top surface that is not abut with conductive material of the second recess), and the bottom surface of the first recess, and (ii) sidewalls of the second recess. A monolithic and continuous body of conductive material is within the first and second recesses. In some such cases, the second recess partially lands on the first recess, and the conformal continuous layer lines part of the top surface of the first recess and part of the bottom surface of the second recess.

In yet another embodiment, a method of forming interconnect features in an integrated circuit comprises forming a first recess within a first interconnect layer and depositing sacrificial material within the first recess. The method further includes forming a second interconnect layer over the first interconnect layer and forming a second recess within the second interconnect layer that is above the first interconnect layer. The second recess abuts the first recess. In an example, the method further includes removing the sacrificial material from the first recess, through the second recess; conformally forming a layer on the walls of the first recess and the second recess; and depositing conductive material in the first recess and the second recess that are lined with the conformal layer.

Numerous variations, embodiments, and applications will be apparent in light of the present disclosure.

General Overview

As previously noted, non-trivial issues remain with respect to scaling interconnect features without incurring performance degradation. For instance, conductive barrier layers (or liners or encapsulation layers) in some example cases necessitate an interface between a first conductive feature of a lower interconnect layer and a second interconnect feature of an interconnect feature of an upper interconnect layer (just above the lower interconnect layer). As such interfaces scale to smaller and smaller dimensions, resistance through that interface tends to exponentially increase. One option is to thin the barrier layer, but too much thinning causes the barrier function to fail (electromigration will occur). Moreover, such a thin barrier is susceptible to increased resistance.

Accordingly, techniques are provided herein to form relatively low-resistance interconnect features. In an embodiment, a first conductive feature (e.g., copper line) of a lower interconnect feature and a second conductive feature (e.g., copper via) of an upper interconnect feature that is just above the lower interconnect feature are formed in the same deposition process, without any barrier layers (e.g., sometimes called liner, or encapsulation layers) between the first and second conductive interconnect features. Thus, the conductive material within the two conductive features is continuous and monolithic, without any seam or barrier layer therebetween. This reduces resistance between the two conductive features, thereby improving performance of the integrated circuit.

Formation of an interconnect feature having monolithic body of conductive material that continuously extends from one layer of the interconnect feature to another layer is performed by replacing sacrificial material with the conductive material, according to some embodiments. For example, initially, a first recess is formed within a lower interconnect layer comprising dielectric material. The first recess is filled with sacrificial material. Subsequently, an upper interconnect layer comprising dielectric material is formed above the lower interconnect layer. A second recess is formed within the upper interconnect layer, such that the second recess at least in part lands on the first recess. Note that the recesses may be perfectly aligned and fully overlap with one another, or they may be misaligned and only partially overlap with one another. In an example, the first recess has a first opening and the second recess has a second opening, where at least a portion of the first opening of the first recess abuts and overlaps with at least a portion of the second opening of the second recess.

Subsequently, the sacrificial material of the first recess is removed through the second recess. Thus, the two recesses are now merged, to form a common or merged recess. A barrier layer is conformally formed on the walls of the merged recess (which comprises the first and second recesses). The barrier layer inhibits electromigration or diffusion of the conductive material from the interconnect features to adjacent dielectric material. Note that the barrier layer may be on sidewalls and bottom surfaces, as well as top surfaces, of the two recesses. Thus, the lining layer acts as a capping layer as well, and hence, eliminates the need to form a dedicated capping layer after deposition of the conductive materials on the recesses. Again, a barrier layer is used in this example, but that layer can be any number of layers and may be called by different names (e.g., liner layer, encapsulation layer, resistance reducing layer, capping layer, or any other layer).

After forming the lining layer, conductive material is deposited within the first and second recesses and planarized, to form a first interconnect feature in the first recess and a second interconnect feature in the second recess. Thus, the conductive material can be deposited within both the first and second recesses using a same deposition process. This eliminates any interfacial layer (e.g., barrier/liner/capping layer(s)) between the conductive material of the first recess and the conductive material of the second recess, as discussed herein, thereby reducing resistance between the first and second interconnect features.

Note that the conductive material is deposited within the first and second recesses, and planarized through a top surface of the upper interconnect layer. In this sense, note that the lower interconnect layer does not undergo any planarization of the conductive material, according to an embodiment. To this end, further note that the dielectric material of the bottom interconnect layer may comprise porous dielectric material. In more detail, introduction of porosity to the dielectric material of an interconnect layer may result in a reduction in mechanical strength, and possible degradation during a planarization or polishing process (such as chemical mechanical polishing (CMP)). However, because the bottom interconnect layer need not undergo any planarization of the conductive material, the bottom interconnect layer can be made porous, which may improve performance.

Note that the above discussed barrier layer (e.g., liner, encapsulation) is conformally deposited in a single process flow in both the first and second recesses. Accordingly, there is no seam or discontinuity between the lining layer of the first recess and the lining layer of the second recess, and the lining layer has a uniform width throughout the first and second recesses.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may be used to detect a monolithic continuous body of conductive material within conjoined recesses of neighboring interconnect layers of a given interconnected structure, and continuous conformal lining layer within the conjoined recesses to provide a barrier layer.

Numerous configurations and variations will be apparent in light of this disclosure.

Architecture and Methodology

FIG. 1A illustrates a perspective view of an integrated circuit device 100 comprising a first interconnect feature 112 coupled to a second interconnect feature 116, where the first interconnect feature 112 and the second interconnect feature 116 comprises a continuous body of conductive material 120, and where a continuous conformal lining layer 124 is on the walls of the first interconnect feature 112 and the second interconnect feature 116, in accordance with an embodiment of the present disclosure. FIGS. 1B and 1C illustrate side views of the integrated circuit device 100 of FIG. 1A, and FIG. 1D illustrates a plan view of the integrated circuit device 100 of FIG. 1A. The cross-sectional view of FIG. 1B is along line A-A' of FIG. 1A, and the cross-sectional view of FIG. 1C is along line B-B' of FIG. 1A.

It may be noted that some components of the interconnect feature 112 (also referred to herein as "structure 112") and the interconnect feature 116 (also referred to herein as "structure 116") are not illustrated in the perspective view of FIG. 1A, although these components are illustrated in FIGS. 1B, 1C, and 1D. For example, conductive material 120 and lining layer 124 of the structures 112, 116 are not illustrated in FIG. 1A, although these components are illustrated in FIGS. 1B, 1C, 1D. Furthermore, dielectric layers 102 and 104 are illustrated to be partially transparent in FIG. 1A, so as to illustrate the outlines of the structures 112, 116 embedded within the dielectric layers 102, 104. In actual implementations, the dielectric layers 102, 104 may not be transparent. Moreover, top left corner of FIG. 1A illustrates an outline of the structures 112, 116, without illustrating the dielectric layers 102, 104 and various components (such as conductive material 120 and lining layer 124) of the structures 112, 116.

Referring to FIGS. 1A-1D, in one embodiment, the integrated circuit device 100 comprises a dielectric layer 101, over which a plurality of interconnect layers 102, 104 are formed. In an example, the interconnect layers 102, 104 comprise dielectric material, such as interlayer dielectric (ILD). Although merely two such interconnect layers 102, 104 are illustrated, the integrated circuit device 100 may comprises more than two such interconnect layers. For example, typically, several interconnect layers (such as interconnect layers 102, 104) are formed above a substrate in an integrated circuit, where each interconnect layer embeds one or more interconnect features (such as conductive lines, vias, redistribution layers or RLDs), e.g., the interconnect features 112, 116. In an example, these interconnect features 112, 116 are used to route signals and power to and/or from various active devices in an underlying (or overlying, as the case may be) device layer of the integrated circuit device 100.

In one embodiment, the dielectric material of the interconnect layer 102 is compositionally different from the dielectric material of the interconnect layer 104. For example, as will be discussed herein later with respect to FIGS. 3D and 3E, the dielectric material of the interconnect layer 102 acts as an etch stop layer, when a recess 117 is being formed within the dielectric material of the interconnect layer 104. Thus, the etching process for formation of the recess 117 has to be selective, such that the etching process etches the dielectric material of the interconnect layer 104, without affecting the dielectric material of the interconnect layer 102. In an example, the dielectric materials of the interconnect layers 102, 104 comprise various combinations of silicon, carbon, nitrogen, and oxygen. For example, the dielectric materials of the interconnect layers 102, 104 comprise silicon dioxide (SiO2), carbon (C)-doped silicon oxide, fluorinated oxide of silicon (e.g., SiOF), carbosiloxane, carbosilane, nitrogen (N)-doped variation of any thereof, or another appropriate dielectric material.

In an example, the dielectric material of the interconnect layer 102 comprises porous dielectric material. Porous dielectric can have several advantages, such as providing greater electrical isolation and lower capacitance between interconnect features. Low-κ materials include materials with κ values lower than, for example, 4.0 (κ value of SiO2), such as porous SiO2.

In an example, the dielectric material of interconnect layer 102 may be formed from a material having a dielectric constant (κ-value) in the range of about 1.6-2.3, which generally may correspond with a porosity value in the range of about 30-60%. In another example, the dielectric material of interconnect layer 102 may be formed from a material having a κ-value of less than or equal to about 1.6, which generally may correspond with a porosity value greater than or equal to about 60%. In yet another example, the dielectric material of interconnect layer 102 may be formed from a material having a κ-value in the range of about 2.3-2.7, which generally may correspond with a porosity value in the range of about 15-30%. In some such examples, the dielectric material of interconnect layer 102 may be formed from a porous dielectric material having an average pore size in the range of about, for example, 0.5 to 10 nm, 1 to 30 nm, 1 to 10 nm, 10 to 30 nm, or any other sub-range in the range of about 0.5-30 nm. Other suitable materials for the dielectric material of interconnect layer 102 will depend on a given application and will be apparent in light of this disclosure.

In the example of FIGS. 1A-1D, the structure 112 is horizontal relative to the plane of the dielectric layer 101, while the structure 116 is vertical relative to the plane of the dielectric layer 101. However, such orientations are merely examples, and any other combination of horizontal and/or vertical orientations of the structures 112, 116 are also possible.

In the example of FIGS. 1A-1D, the structure 112 is formed in a horizontal recess 113 (also referred to herein as a trench 113 or a conduit 113) within the interconnect layer 102. For example, sidewalls and bottom surface of the structure 112 abut the interconnect layer 102. The interconnect layer 104 is on top or above the structure 112. The recess 113 of the structure 112 has an opening in the top surface of the structure 112, through which the structure 116 contacts the structure 112.

In the example of FIGS. 1A-1D, the structure 112 is formed in a vertical recess 117 (also referred to herein as a trench 117 or a conduit 117) within the interconnect layer 104. For example, sidewalls of the structure 116 abut the interconnect layer 104. The interconnect layer 102 and the structure 112 is underneath the structure 116. The recess 117 of the structure 116 has an opening in the bottom of structure 116, through which the structure 116 contacts the structure 112.

In the example of FIGS. 1A-1D, the structure 116 is off-centered or misaligned with respect to the structure 112, and hence, a portion of the bottom opening of the structure 116 is in contact with the structure 112, while another portion of the bottom opening of the structure 116 is in contact with and above the interconnect layer 102.

Although FIGS. 1A-1D illustrate the structure 116 to be off-centered with respect to the structure 112, in another example, the structure 116 may be aligned with respect to the structure 112. In such an example, an entirety of the bottom surface of the structure 116 may be over the structure 112, e.g., when the structure 116 fully lands over the structure 112. In an example, the misalignment and off-centering of the structure 116 with respect to the structure 112 may be because of unintentional technical limitations in the process flow for forming the structure 116 over the structure 112.

In an example, the structure 116 is a conductive via within the interconnect layer 104. In an example, the structure 112 is a conductive line within the interconnect layer 102. Thus, the integrated circuit device 100 comprises the conductive via 116 landing on the conductive line 112.

The teachings of this disclosure may also be applied to form a via-over-via structure though the interconnect layers 102, 104. For example, the structure 116 may be a conductive via within the interconnect layer 104. In an example, the structure 112 may be appropriately sized, such that the structure 116 is a conductive via within the interconnect layer 102. Thus, in such an example, the structures 112, 116 may form a via-over-via structure within the interconnect layers 102, 104.

In one embodiment, a lining layer 124 lines the walls (e.g., the sidewalls, and the top and bottom surfaces) of the recesses 113 and 117 of the structures 112 and 116, respectively. In an example, the lining layer 124 is a continuous conformal layer on both the recesses 113, 117. Thus, for example, there is no seam or break in a section of the lining layer 124 that lines the walls of the recess 113 and another section of the lining layer 124 that lines the walls of the recess 117. Note that the walls herein include sidewalls, and as well as top and bottom surfaces. The entire lining layer 124 in both recesses 113, 117 are formed during a single conformal deposition process, and hence, is a continuous conformal lining layer.

Figure 3A:
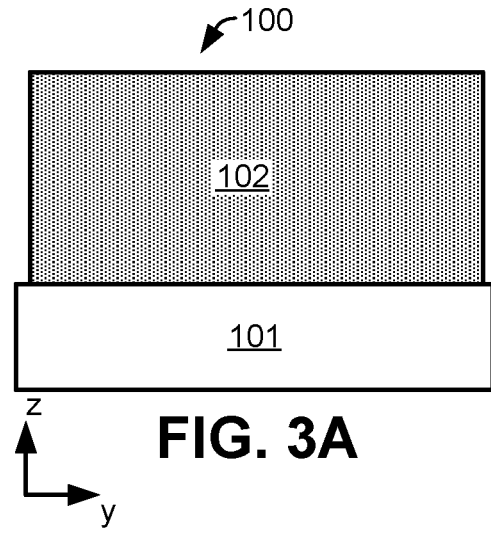
FIGS. 3A-3I illustrate cross-sectional views of example first interconnect feature and second interconnect feature in various stages of processing, in accordance with an embodiment of the present disclosure.
Figure 3B:
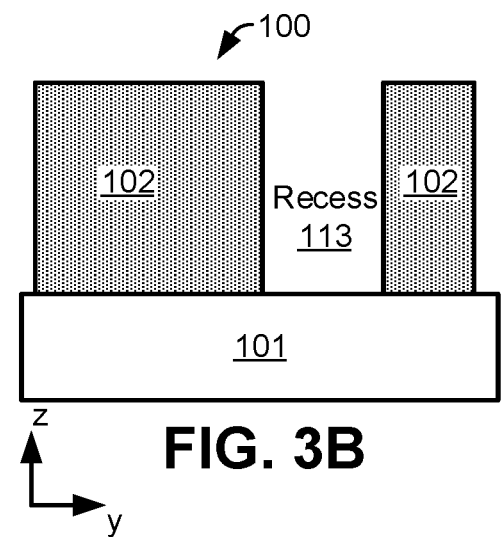
Figure 3C:
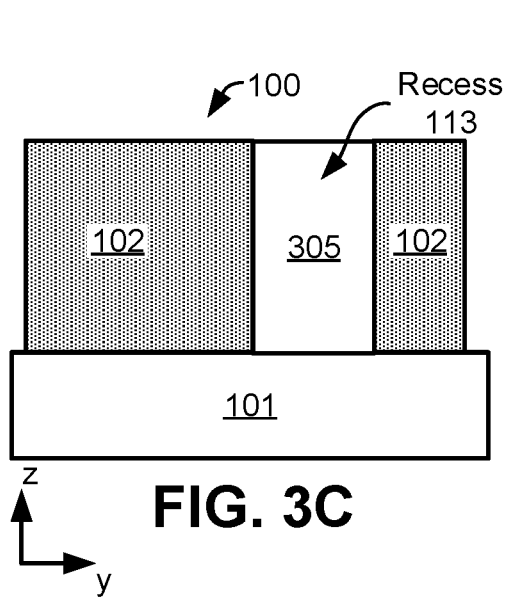
Figure 3D:
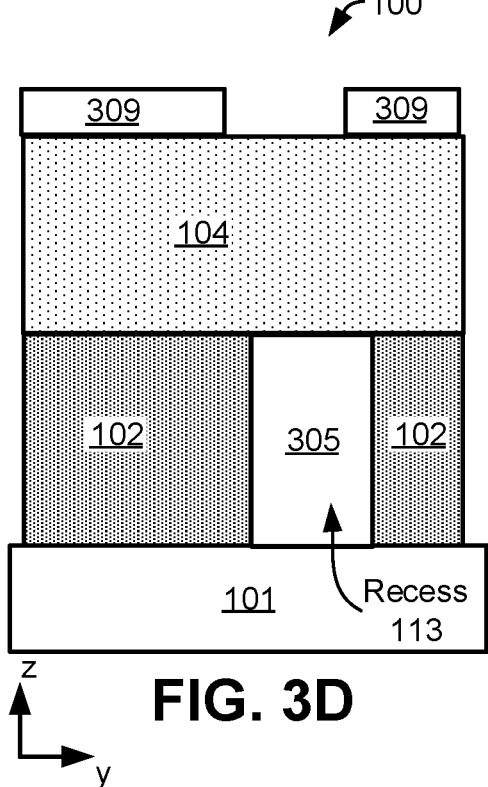

Also, as will be discussed herein later with respect to FIG. 3G, the entire lining layer 124 is deposited during a single conformal deposition process. Accordingly, in an example, a thickness of the lining layer 124 is uniform (e.g., varies at most by 1%, 2%, or 5%) throughout the structures 112, 116. For example, a thickness of the lining layer 124 on a top wall the structure 112 is within 5% (or within 2% or 1%) of a thickness of the lining layer 124 on one or more sidewalls and bottom surface of the structure 116. In another example, a thickness of the lining layer 124 on the top wall the structure 112 is within 5% (or within 2% or 1%) of a thickness of the lining layer 124 on one or more sidewalls and bottom surface of the structure 112.

Note that due to the misalignment between the recesses 117 and 113, a first portion of the bottom opening of the structure 116 is in contact with the structure 112, while a second portion of the bottom opening of the structure 116 is in contact with and above the interconnect layer 102. As illustrated in FIG. 1B, the lining layer 124 is also on the second portion of the bottom opening of the structure 116 that is in contact with and above the interconnect layer 102.

Furthermore, as illustrated in FIGS. 1B-1D, the lining layer 124 is also on sections of the top wall of the structure 112 that does not abut the conductive material of the structure 116. That is, the lining layer 124 is on a partial top wall of the recess 113.

In one embodiment, the lining layer 124 acts as a liner or barrier layer, as well as a capping (or encapsulation) layer. As previously discussed herein, the conductive material 120 within the structures 112, 116 tends to diffuse through the dielectric material of the interconnect layers 102, 104. In an example where the conductive material 120 is copper, the diffusion may result in formation of undesirable copper oxide. The lining layer 124, in an example, prevents diffusion of the conductive material 120 to adjacent dielectric material of the interconnect layers 102, 104. Furthermore, the lining layer 124 facilitates better adhesion of the conductive material 120 on walls of the interconnect feature 112, 116.

In an example, the lining layer 124 has a width or thickness in the range of 1 to 5 nanometers (nm), or 1 to 10 nm, or 0.5 to 10 nm. Suitable materials for the lining layer 124 include barrier layer refractory metals and alloys, cobalt, cobalt-nickel (CoNi), ruthenium-cobalt combination, molybdenum, nickel, manganese, titanium-tungsten (Ti), tantalum (Ta), tantalum-nitride (TaN), tantalum-silicon-nitride (TaSiN), titanium-nitride (TiN), titanium-silicon-nitride (TiSiN), tungsten (XV), tungsten-nitride (WN), tungsten-silicon-nitride (WiSiN), and/or combinations of such materials (e.g., a multi-lay stack of Ta/TaN).

In one embodiment, the recesses 113 and 117 of the structures 112 and 116, respectively, are filled with the conductive material 120. In an example, the conductive material 120 is continuous and monolithic within both the recesses 113, 117. Thus, for example, there is no seam or break between one section of the conductive material 120 within the recess 113 and another section of the conductive material 120 within the recess 117. For example, the conductive material 120 are deposited in a single process flow within both recesses 113, 117, thereby forming a single monolithic and continuous body or structure of conductive material within both recesses 113, 117. In an example, the conductive material 120 comprises suitable conductive materials such as pure copper, ruthenium, molybdenum, tungsten, aluminum, an alloy such as copper-tin (CuSn), copper indium (CuIn), copper-antimony (CuSb), copper-bismuth (CuBi), copper-rhenium (CuRe), and/or any other suitable conductive material.

In an example, the recesses 113, 117, in which the interconnect feature 112, 116, respectively, are formed, can be of appropriate dimensions. For example, the recesses 113, 117 can have a width in the range of about 12 to 20 nm, or about 8-40 nm, or about 4-40 nm. The lining layer 124 may have a width or thickness in the range of 1 to 5 nm, or about 0.5 to 10 nm. A width of the conductive material 120 within the recesses 113, 117 can be in the range of 10 to 18 nm, or about 2-40 nm. In an example, the recess 113 can be offset with respect to the recess 117 by a margin of about 1 to 4 nm, or about 0 to 8 nm.

FIGS. 1A and 1D illustrate a width of the structure 112 to be w1 and a width of the structure 116 to be w2. The widths w1 and w2 are measured in a horizontal direction, parallel to a plane of the interconnect layers 102, 104. In one embodiment, the widths w1 and w2 may be similar, e.g., within 1%, 2%, 5%, or 10% of each other. In another embodiment, the width w1 is at least 5% or 10% more than the width w2.

Figure 2:
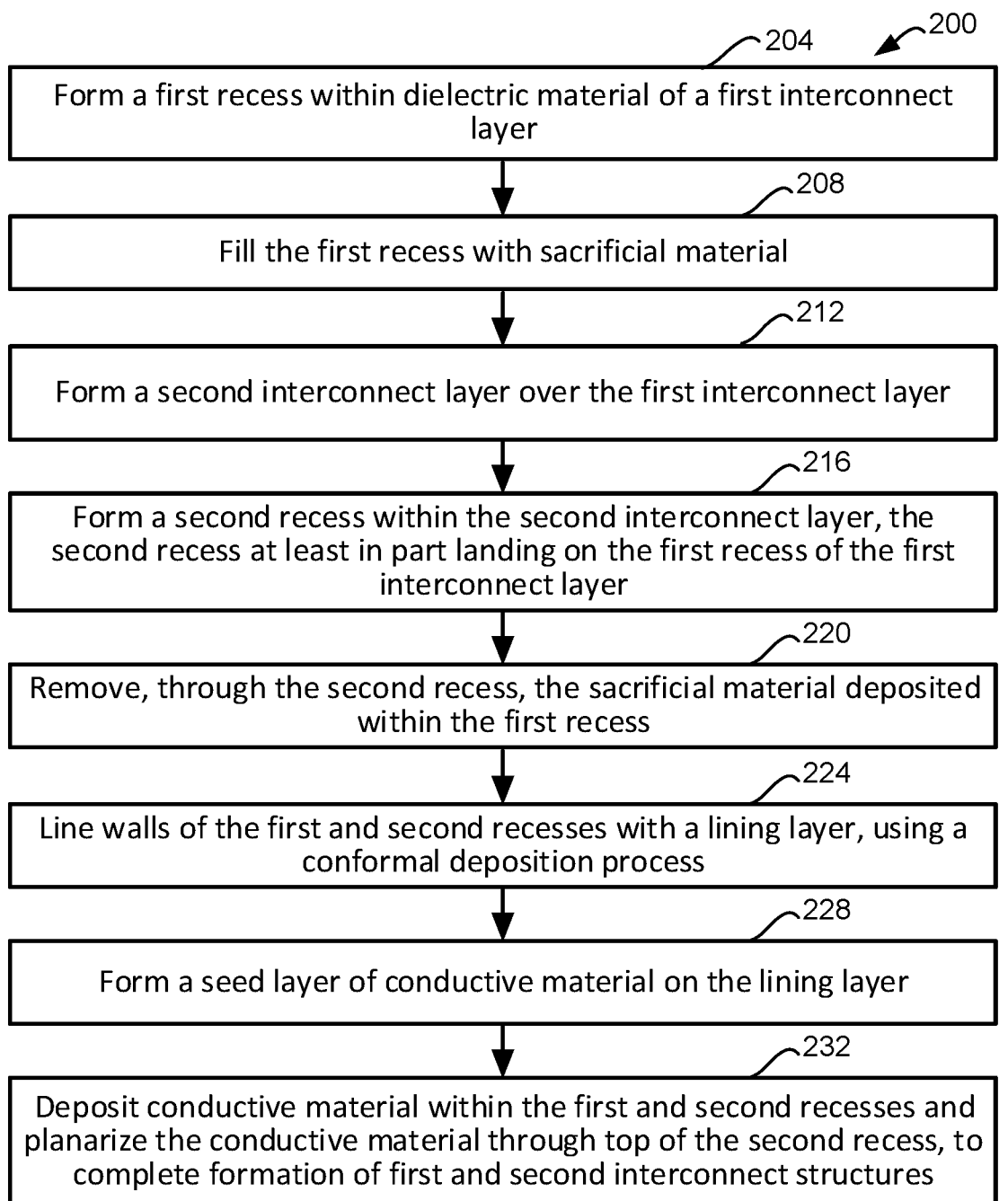
FIG. 2 illustrates a flowchart depicting a method of forming a first interconnect feature coupled to a second interconnect feature, where the first interconnect feature and the second interconnect feature comprises a continuous body of conductive material that extends from one interconnect layer to the next interconnect layer, in accordance with an embodiment of the present disclosure.

FIG. 2 illustrates a flowchart depicting a method 200 of forming a first interconnect feature coupled to a second interconnect feature, where the first interconnect feature and the second interconnect feature comprises a continuous body of conductive material, and where a continuous conformal lining layer is on the inner walls of the first interconnect feature and the second interconnect feature, in accordance with an embodiment of the present disclosure. FIGS. 3A-3I illustrate cross-sectional views of example first interconnect feature and second interconnect feature in various stages of processing, in accordance with an embodiment of the present disclosure. FIGS. 2 and 3A-3I will be discussed in unison. The first interconnect feature and the second interconnect feature of FIGS. 2 and 3A-3I are, for example, the interconnect features 112 and 116, respectively, of FIGS. 1A-1D.

Note that the cross-sectional views of FIGS. 3A-3D are along line A-A' of FIG. 1A. That is, the cross-sectional views of FIGS. 3A-3D are similar to the view of FIG. 1B.

Each of FIGS. 3E-3I illustrate two cross-sectional views: (i) left side of each of FIGS. 3E-3I illustrate cross-sectional views along line A-A' of FIGS. 1A, similar to the view of FIG. 1B, and (ii) right side of each of FIGS. 3E-3I illustrate cross-sectional views along line B-B' of FIGS. 1A, similar to the view of FIG. 1C.

Referring to FIG. 2, the method 200 includes, at 204, forming a first recess within dielectric material of a first interconnect layer. FIGS. 3A and 3B illustrate forming the recess 113 within dielectric material of the interconnect layer 102. For example, FIG. 3A illustrates formation of the interconnect layer 102 over the dielectric layer 101, e.g., using a suitable deposition technique, such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example. Subsequently, the recess is formed within the interconnect layer 102 using suitable masking, lithography, and etching techniques.

Referring again to FIG. 2, the method 200 proceeds from 204 to 208, where the first recess is filled with a sacrificial material. FIG. 3C illustrates the recess 113 filled with sacrificial material 305. For example, the sacrificial material 305 may be deposited within the recess 113 using a suitable deposition technique, such as CVD, PVD, ALD, VPE, MBE, or LPE, for example. In an example, the deposited sacrificial material 305 is planarized, such that a top surface of the sacrificial material 305 is flush or coplanar with a top surface of the interconnect layer 102. A suitable planarization technique may be used, such as CMP.

In an example, the sacrificial material 305 is selected to be etch selective with respect to the dielectric material of the interconnect layer 104, such that the sacrificial material 305 can act as an etch stop layer when a recess 117 is to be formed later within the interconnect layer 104 (see FIG. 3E herein later). Merely as an example, the sacrificial material 305 may comprise silicon nitride (SiN) or another appropriate sacrificial material.

Referring again to FIG. 2, the method 200 proceeds from 208 to 212, where a second interconnect layer is formed over the first interconnect layer. FIG. 3D illustrates formation of the second interconnect layer 104 over the first interconnect layer 102. Example materials and porosity of the interconnect layers 102, 104 have been discussed herein previously. In an example, the interconnect layers 102, 104 are compositionally different, and the interconnect layer 102 acts as an etch stop layer when a recess 117 is to be etched within the interconnect layer 104 (see FIG. 3E).

Referring again to FIG. 2, the method 200 proceeds from 212 to 216, where a second recess is formed within the second interconnect layer, such that the second recess at least in part lands on the first recess of the first interconnect layer. FIG. 3E illustrates the recess 117 formed within the interconnect layer 104, where the recess 117 at least in part lands on the recess 113 of the interconnect layer 102. For example, as illustrated in FIG. 3D, a patterned mask 309 is deposited over the interconnect layer 104, and the dielectric material of the interconnect layer 104 is etched through the masks 309 via an anisotropic etch process, to form the recess 117.

Figure 3E:
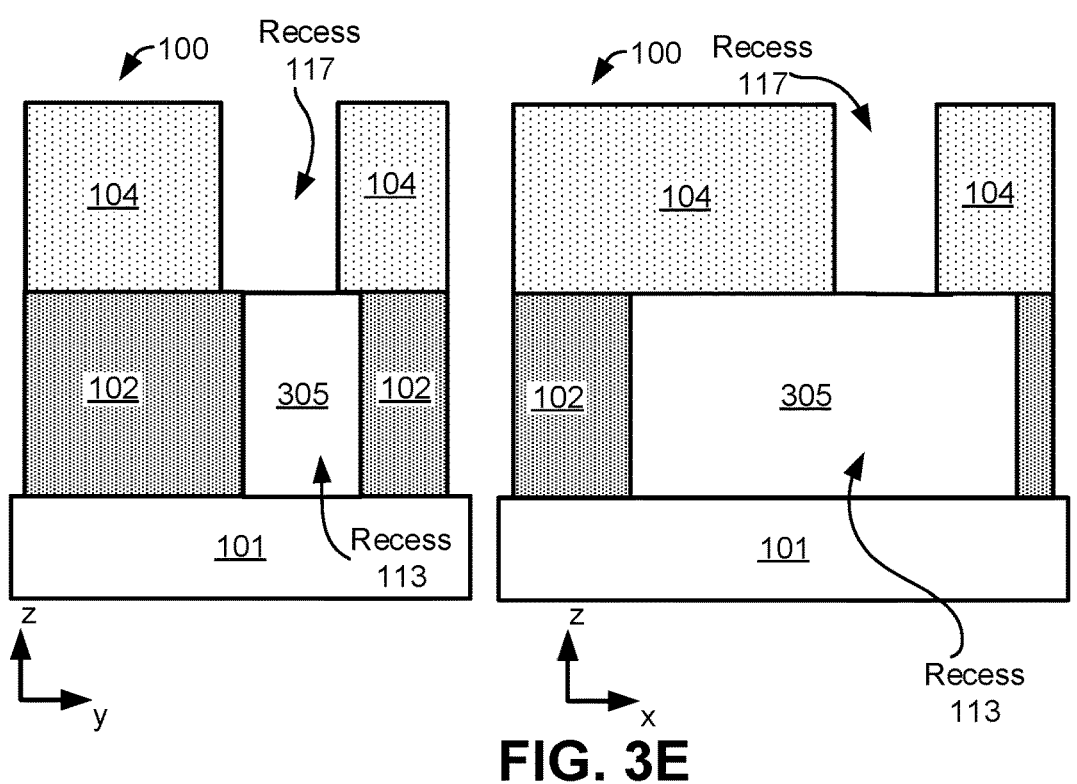

In an example of FIG. 3E, the recesses 117 and 113 are slightly off-centered, and the recess 117 does not perfectly land of the recess 113, e.g., due to unintentional limitations in the process of placing the masks 309 to be perfectly aligned with the recess 113. However, in another example, the recesses 117 and 113 are fully aligned, such that the recess 117 perfectly or fully lands on the recess 113.

In an example, the dielectric material of the interconnect layer 102 and the sacrificial material 305 act as an etch stop layer, when forming the recess 117 within the dielectric material of the interconnect layer 104. As previously discussed herein, the materials of the interconnect layer 102, the sacrificial material 305, and the interconnect layer 104 are selected to be etch selective, such that the dielectric material of the interconnect layer 102 and the sacrificial material 305 can act as the etch stop layer.

Figure 3F:
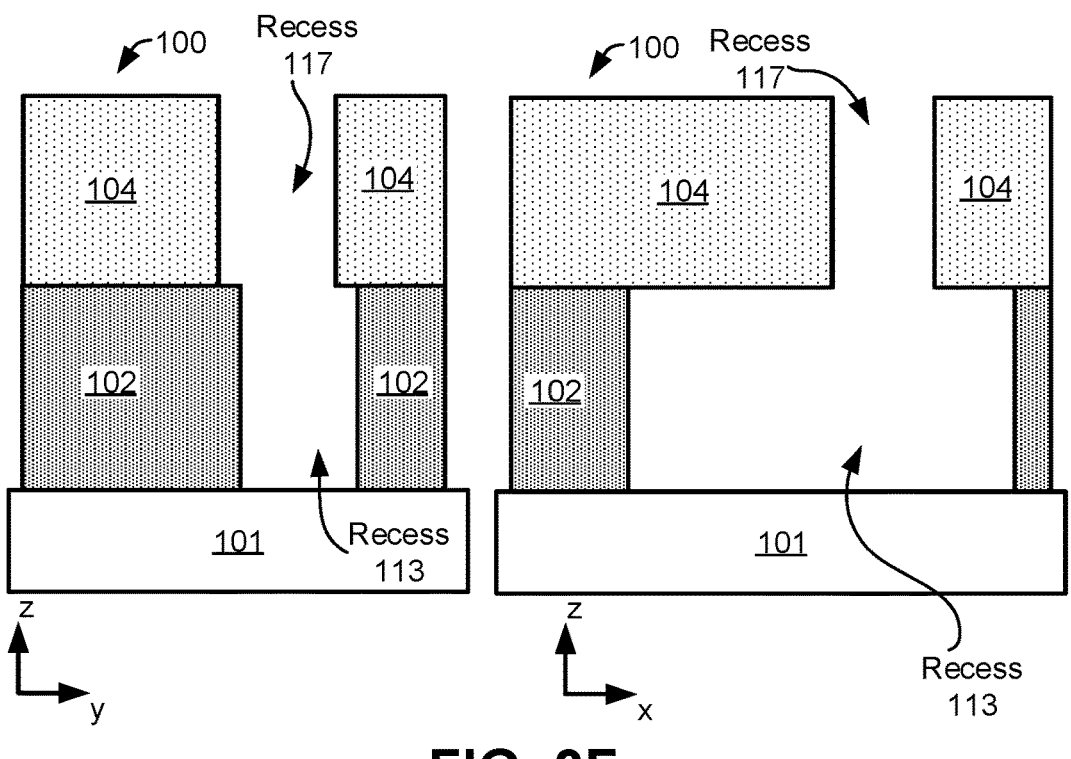
Figure 3G:
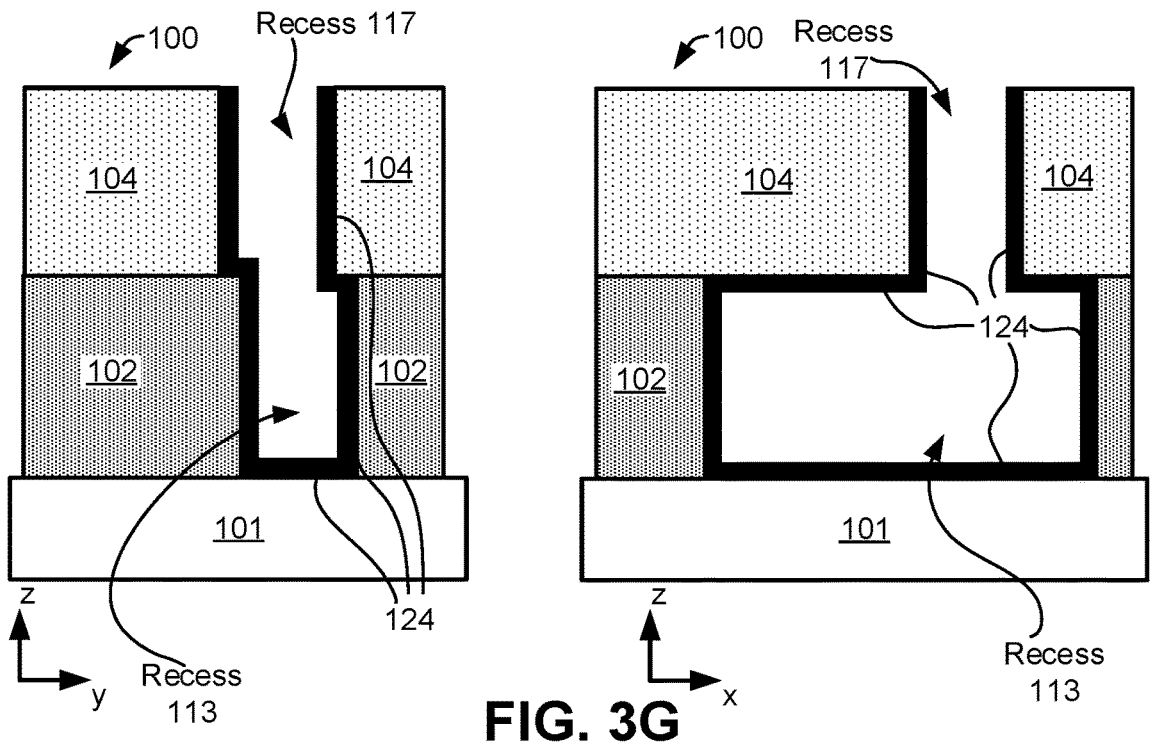

Referring again to FIG. 2, the method 200 then proceeds from 216 to 220, where the sacrificial material deposited within the first recess is removed through the second recess. For example, FIG. 3F illustrates the sacrificial material 305 removed from the recess 113, through the recess 117. An appropriate etching technique may be used to remove the sacrificial material, such as an isotropic etch process (e.g., nitric acid/hydrofluoric acid) or another suitable etch process. After the etch, the recesses 113 and 117 are merged to form a combined recess.

Referring again to FIG. 2, the method 200 then proceeds from 220 to 224, where the walls of the first and second recesses are lined with a lining layer, e.g., using a conformal deposition process. FIG. 3G illustrates a lining layer 124 conformally deposited within the recesses 113, 117. Because the lining layer 124 is deposited on walls of both recesses 113, 117 at the same time and using the same deposition process, the lining layer 124 on the walls of the recesses 113, 117 is a continuous and conformal lining layer. That is, there is no seam or discontinuity between the lining layer 124 deposited on walls of the recess 113 and the lining layer 124 deposited on walls of the recess 117. For example, atomic layer epitaxy, CVD, PVD, ALD, VPE, MBE, LPE, or other suitable conformal deposition technique is used to deposit the lining layer 124 on the walls of the recesses 113, 117.

It may be noted that the walls of the recesses 113, 117, on which the lining layer 124 is conformally formed, includes sidewalls, bottom wall, and top wall of the recesses 113, 117. Thus, the lining layer 124 on sidewalls, bottom wall, and top wall of the recesses 113, 117 are compositionally similar and comprise a continuous conformal lining layer. Example material for the lining layer 124 has been discussed herein earlier.

Figure 3H:
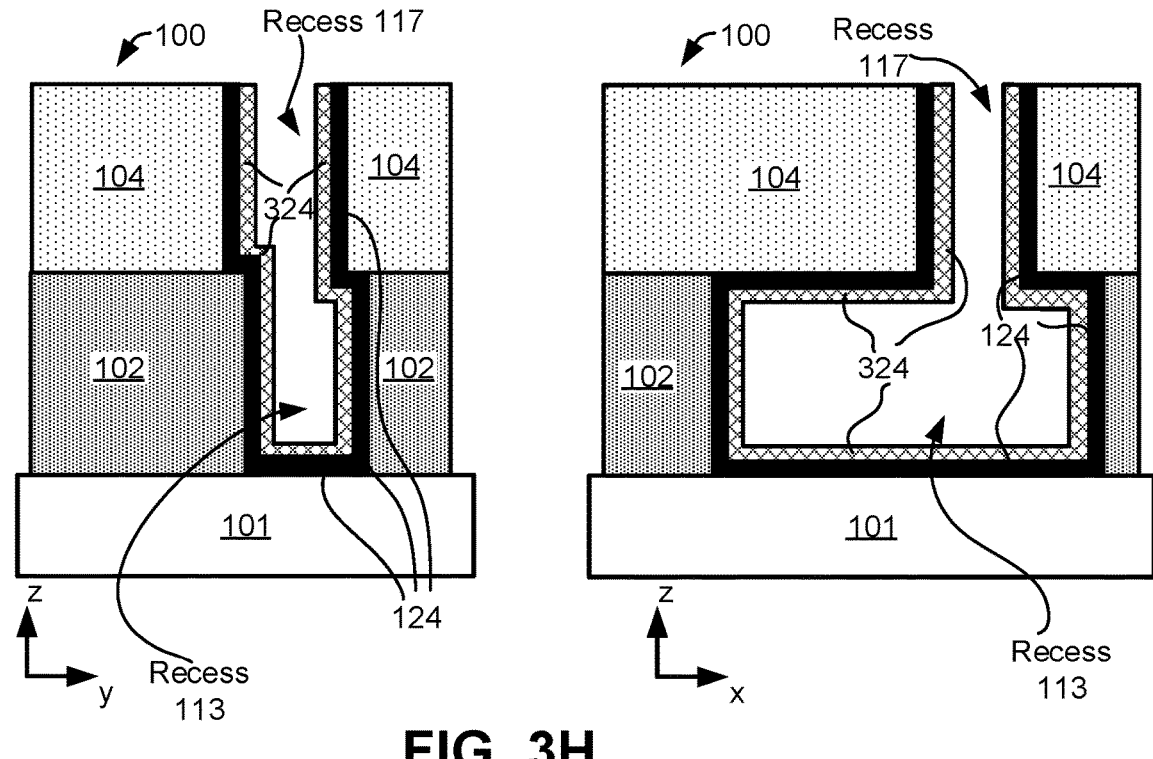

Referring again to FIG. 2, the method 200 then proceeds from 224 to 228, where a seed layer of conductive material is formed on the lining layer. For example, FIG. 3H illustrates conformal and continuous seed layer 324 formed on the lining layer 124 of the recesses 113, 117. The seed layer 324 may be formed by a deposition process such as atomic layer epitaxy, CVD, PVD, ALD, VPE, MBE, LPE, via electroplating, on the lining layer 124, e.g., in order to improve subsequent deposition of conductive material 120. In an example, one or more monolayers of seed material may be used. In an example, the seed layer 324 may be deposited using an electroless deposition. In an example, the seed material is to be subsequently used for an electroplating deposition. In an example, the seed layer 324 comprises copper (Cu) or an alloy of copper (e.g., copper-tin (CuSn), copper-indium (CuIn), copper-magnesium (CuMg), copper-aluminum (CuAl)), cobalt, and/or the like, e.g., to assist with a subsequent formation of a copper containing conductive material 120 thereon.

In an example, the process 228 of seed layer formation may be performed if the final conductive material 120 to be deposited in the interconnect features 112, 116 include copper or another appropriate metal or metal alloy that is to be electroplated. For example, if the final conductive material 120 include copper, then the copper is to be deposited using an electroplating process on the seed layer 324. The seed layer 324 is used to facilitate the electroplating process.

However, if the final conductive material 120 in the interconnect features 112, 116 can be deposited using another deposition technique different from electroplating (such as CVD or PVD or ALD), then the process of forming the seed layer 324 can be skipped in an example. In an example, ruthenium may be used as the conductive material 120 and may be deposited using ALD, and hence, deposition of ruthenium may not necessitate the formation of the seed layer 324. Hence, the process 228 may be skipped in such an example.

Figure 3I:
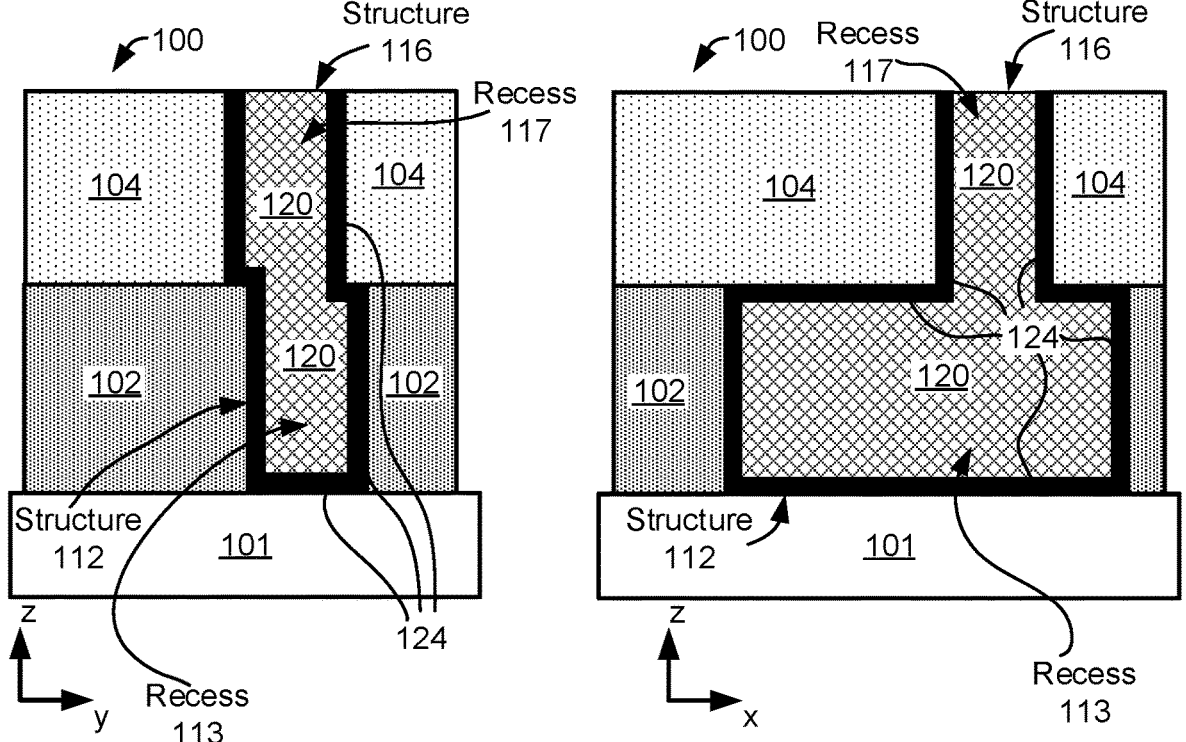

Referring again to FIG. 2, the method 200 then proceeds from 228 to 232, where conductive material is deposited within the first and second recesses, and the conductive material is planarized through top of the second recess, to complete formation of first and second interconnect features. For example, FIG. 3I illustrates the final interconnect features 112, 116 (where FIG. 3I is similar to FIGS. 1B and 1C), where conductive material 120 is deposited within the recesses 113, 117, and the conductive material 120 is planarized through top of the recess 117. In an example, the conductive material 120 comprising copper may be deposited via electroplating. In another example, electroless deposition, CVD, PVD, ALD or another suitable deposition technique may be used, e.g., when the conductive material 120 comprises ruthenium or another appropriate conductive material. After deposition of the conductive material 120, the conductive material 120 is planarized from the top surface of the recess 117 and the top surface of the interconnect layer 104, e.g., using CMP, mechanical polishing, or another suitable planarization technique.

Note that the planarization process (such as CMP) on the conductive material 120 is performed during the process 232, and at the top surface of the interconnect layer 104. No such planarization process is performed at the top surface of the interconnect layer 102, for purposes of removing excess conductive material deposition. Accordingly, the dielectric material of the interconnect layer 102 can be porous, according to some embodiments.

In one embodiment, the recesses 113 and 117 of the structures 112 and 116, respectively, are filled with the conductive material 120 during the same deposition process of 232. Thus, the conductive material 120 is continuous and monolithic within both the recesses 113, 117. Thus, for example, there is no seam or break in one section of the conductive material 120 within the recess 113 and another section of the conductive material 120 within the recess 117. Note that the top walls of the interconnect feature 112 already has the lining layer 124 deposited thereon (e.g., formed during the process 224 of FIG. 2). Thus, no separate lining layer process is needed for the upper walls of the interconnect feature 112.

Note that the processes in method 200 are shown in a particular order for ease of description. However, one or more of the processes may be performed in a different order or may not be performed at all (and thus be optional), in accordance with some embodiments. Numerous variations on method 200 and the techniques described herein will be apparent in light of this disclosure.

Example System

Figure 4:
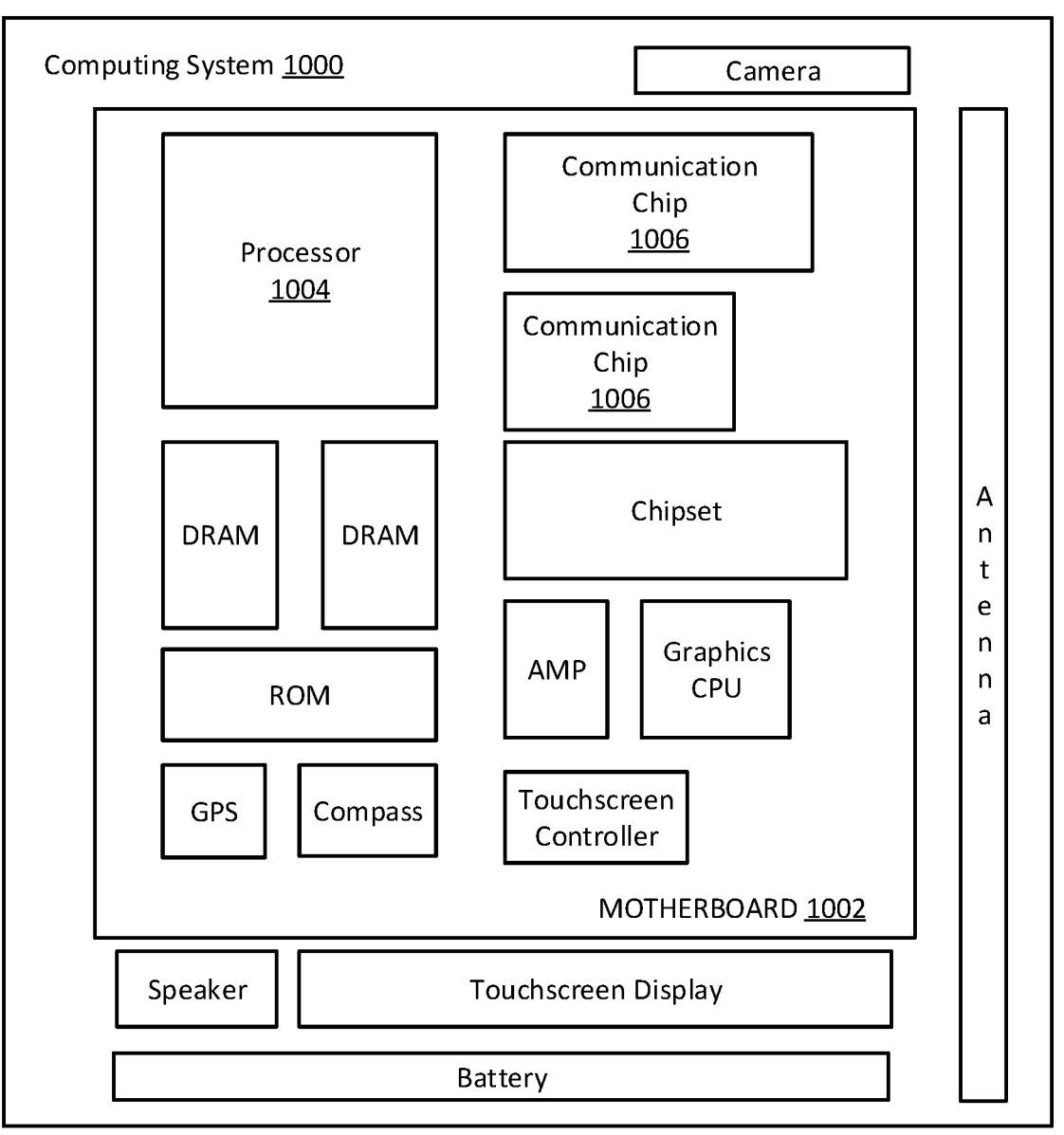
FIG. 4 illustrates a computing system implemented with integrated circuit structures having one or more interconnect features formed using the techniques disclosed herein, in accordance with some embodiments of the present disclosure.

FIG. 4 illustrates a computing system 1000 implemented with integrated circuit structures and/or the interconnect features formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following examples pertain to further embodiments, from which numerous permutations and configurations will be apparent.

Example 1. An integrated circuit structure comprising: a first interconnect layer comprising a first dielectric material, the first dielectric material having a first recess therein, the first recess having a first opening; a second interconnect layer above the first interconnect layer and comprising a second dielectric material, the second dielectric material having a second recess therein, the second recess having a second opening, wherein at least a portion of the first opening of the first recess abuts and overlaps with at least a portion of the second opening of the second recess; a continuous layer on walls of the first and second recesses; and a continuous body of conductive material within the first and second recesses.

Example 2. The integrated circuit structure of example 1, wherein the walls of the first recess on which the continuous layer is present comprise one or more sidewalls, a partial top wall, and a bottom wall.

Example 3. The integrated circuit structure of any one of examples 1-2, wherein the walls of the second recess on which the continuous layer is present comprise one or more sidewalls and a partial bottom wall.

Example 4. The integrated circuit structure of any one of examples 1-3, wherein the continuous layer on the walls of the first and second recesses is conformal.

Example 5. The integrated circuit structure of any one of examples 1-4, wherein the portion of the continuous body of conductive material in the first recess is laterally offset from the portion of the continuous body of conductive material in the second recess.

Example 6. The integrated circuit of any one of examples 1-5, wherein the first dielectric material is compositionally different from the second dielectric material.

Example 7. The integrated circuit of any one of examples 1-6, wherein the first dielectric material comprises porous dielectric material, and the second dielectric material comprises non-porous dielectric material.

Example 8. The integrated circuit of any one of examples 1-7, wherein the first dielectric material has porosity that is higher than porosity of the second dielectric material.

Example 9. The integrated circuit of any one of examples 1-8, wherein the first dielectric material has porosity value in the range of 15-60%.

Example 10. The integrated circuit of any one of examples 1-10, wherein the first dielectric material has pores in the range of 1 nm to 30 nm.

Example 11. The integrated circuit structure of any one of examples 1-10, wherein the at least a portion of the second opening of the second recess is a first portion of the second opening, and wherein the first recess is laterally offset with respect to the second recess, such that (i) the first portion of the second opening of the second recess abuts and overlaps with the at least a portion of the first opening of the first recess, and (ii) a second portion of the second opening of the second recess abuts and is above the first interconnect layer.

Example 12. The integrated circuit structure of example 11, wherein the continuous layer extends along the second portion of the second opening of the second recess that is above the first interconnect layer.

Example 13. The integrated circuit structure of any one of examples 1-12, wherein the first recess is laterally offset with respect to the second recess Example 14. The integrated circuit structure of any one of examples 1-13, wherein the continuous layer on the walls of the first and second recesses comprises one or more of cobalt, nickel, ruthenium, molybdenum, manganese, titanium, tungsten, tantalum, nitrogen, silicon.

Example 15. The integrated circuit structure of any one of examples 1-14, wherein the continuous layer on the walls of the first and second recesses comprises metal.

Example 16. The integrated circuit structure of any one of examples 1-15, wherein the conductive material comprises one or more of copper or ruthenium.

Example 17. The integrated circuit structure of any one of examples 1-16, wherein the conductive material comprises one or more of copper, ruthenium, molybdenum, tin, indium, antimony, aluminum, or bismuth.

Example 18. The integrated circuit structure of any one of examples 1-17, wherein the conductive material within the first recess forms a conductive signal line through the first interconnect layer, and wherein the conductive material within the second recess forms a conductive via passing through the second interconnect layer.

Example 19. The integrated circuit structure of any one of examples 1-17, wherein the conductive material within the first recess forms a first conductive via through the first interconnect layer, and wherein the conductive material within the second recess forms a second conductive via passing through the second interconnect layer.

Example 20. The integrated circuit structure of any one of examples 1-19, wherein: the first recess has a first width measured in a horizontal direction that is parallel to a plane of the first interconnect layer; the second recess has a second width measured in the horizontal direction that is parallel to the plane of the first interconnect layer; and the first width is within 5% of the second width.

Example 21. The integrated circuit structure of any one of examples 1-20, wherein: the first opening has a first diameter that is within 5% of a second diameter of the second opening.

Example 22. A semiconductor device comprising: a first recess within a first dielectric layer; a second recess within a second dielectric layer, and at least in part landing on the first recess; a conformal continuous layer lining (i) sidewalls, top surface, and bottom surface of the first recess, and (ii) sidewalls of the second recess; and monolithic conductive material within the first and second recesses.

Example 23. The semiconductor device of example 22, wherein the first recess has a first width measured in a horizontal direction and the second recess has a second width measured in the horizontal direction, the horizontal direction parallel to a plane of the first dielectric layer, and wherein the first width is within 5% of the second width.

Example 24. The semiconductor device of any one of examples 22-23, further comprising: a first interconnect layer comprising the first dielectric layer; and a second interconnect layer comprising the second dielectric layer and above the first interconnect layer.

Example 25. The semiconductor device of any one of examples 22-24, wherein the second recess in part lands on the first recess, such that the second recess is off-set with respect to the first recess.

Example 26. The semiconductor device of any one of examples 22-25, wherein the first dielectric material has a porosity that is higher than a porosity of the second dielectric material.

Example 27. A method of forming interconnect features in an integrated circuit, comprising: forming a first recess within a first interconnect layer; depositing sacrificial material within the first recess; forming a second interconnect layer over the first interconnect layer; forming a second recess within the second interconnect layer that is above the first interconnect layer, wherein the second recess abuts the first recess and is conjoined with the first recess through an opening in the first recess; removing the sacrificial material from the first recess, through the opening and the second recess; conformally forming a layer on the walls of the first recess and the second recess; and depositing conductive material in the first recess and the second recess that are lined with the conformal layer.

Example 28. The method of example 27, further comprising: subsequent to conformally forming the layer on the walls of the first recess and the second recess, forming a seed layer on the layer on the walls, the seed layer comprises seed material for depositing the conductive material; and depositing the conductive material by electroplating the conductive material on the seed layer.

Example 29. The method of any one of examples 27-28, wherein depositing the conductive material comprises: depositing the conductive material via electroplating.

Example 30. The method of any one of examples 27-29, wherein depositing the conductive material comprises: depositing the conductive material via chemical vapor deposition (CVD), physical vapor deposition (PVD), atomic layer deposition (ALD), vapor-phase epitaxy (VPE), molecular beam epitaxy (MBE), liquid-phase epitaxy (LPE), or electroplating.

Example 31. The method of any one of examples 27-30, wherein conformally forming the layer on the walls of the first recess and the second recess comprises: conformally forming the layer on (i) sidewalls, top surface, and bottom surface of the first recess, and (ii) sidewalls of the second recess.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit structure comprising:
a device layer comprising one or more devices;
a dielectric layer above the device layer;
a first interconnect layer above the dielectric layer and comprising a first dielectric material, the first dielectric material having a first recess therein, the first recess having a first opening;
a second interconnect layer above the first interconnect layer and comprising a second dielectric material, the second dielectric material having a second recess therein, the second recess having a second opening, wherein at least a first portion of the first opening of the first recess abuts and overlaps with at least a portion of the second opening of the second recess, and at least a second portion of the first opening of the first recess does not overlap with any portion of the second opening of the second recess;
a continuous layer on walls of the first and second recesses; and
a continuous body of conductive material within the first and second recesses.

2. The integrated circuit structure of claim 1, wherein the walls of the first recess on which the continuous layer is present comprise one or more sidewalls, a partial top wall, and a bottom wall.

3. The integrated circuit structure of claim 1, wherein the walls of the second recess on which the continuous layer is present comprise one or more sidewalls and a partial bottom wall.

4. The integrated circuit structure of claim 1, wherein the continuous layer on the walls of the first and second recesses is conformal.

5. The integrated circuit structure of claim 1, wherein the portion of the continuous body of conductive material in the first recess is laterally offset from the portion of the continuous body of conductive material in the second recess.

6. The integrated circuit structure of claim 1, wherein the first dielectric material comprises porous dielectric material, and the second dielectric material comprises non-porous dielectric material.

7. The integrated circuit structure of claim 1, wherein the first recess is laterally offset with respect to the second recess, such that the second portion of the first opening of the first recess abuts and is below the second interconnect layer.

8. The integrated circuit structure of claim 7, wherein the continuous layer extends along the second portion of the second opening of the second recess that is above the first interconnect layer.

9. The integrated circuit structure of claim 1, wherein the conductive material comprises one or more of copper, ruthenium, molybdenum, tin, indium, antimony, aluminum, or bismuth.

10. The integrated circuit structure of claim 1, wherein the conductive material within the first recess forms a conductive signal line through the first interconnect layer, and wherein the conductive material within the second recess forms a conductive via passing through the second interconnect layer.

11. The integrated circuit structure of claim 1, wherein the conductive material within the first recess forms a first conductive via through the first interconnect layer, and wherein the conductive material within the second recess forms a second conductive via passing through the second interconnect layer.

12. The integrated circuit structure of claim 1, wherein:
the first recess has a first width measured in a horizontal direction that is parallel to a plane of the first interconnect layer;
the second recess has a second width measured in the horizontal direction that is parallel to the plane of the first interconnect layer; and
the first width is within 5% of the second width.

13. The integrated circuit structure of claim 1, wherein:
the first opening has a first diameter that is within 5% of a second diameter of the second opening.

14. A semiconductor device comprising:
a device layer comprising one or more devices;
a first dielectric layer above the device layer;
a first recess above the first dielectric layer within a second dielectric layer, such that a bottom surface of the first recess is directly on a top surface of the first dielectric layer;
a second recess within a third dielectric layer, and landing on only a portion of the first recess;
a conformal continuous layer lining (i) sidewalls, top surface, and the bottom surface of the first recess, and (ii) sidewalls of the second recess; and
monolithic conductive material within the first and second recesses.

15. The semiconductor device of claim 14, wherein the first recess has a first width measured in a horizontal direction and the second recess has a second width measured in the horizontal direction, the horizontal direction parallel to a plane of the first dielectric layer, and wherein the first width is within 5% of the second width.

16. The semiconductor device of claim 14, wherein the second recess is off-set with respect to the first recess.

17. The semiconductor device of claim 14, wherein the second dielectric layer has a first dielectric material, and the third dielectric layer has a second dielectric material, wherein the first dielectric material has a porosity that is higher than a porosity of the second dielectric material.

18. A method of forming interconnect features in an integrated circuit, comprising:
forming a device layer comprising one or more devices;
forming a first dielectric layer above the device layer;
forming a first recess within a first interconnect layer, the first interconnect layer being above the first dielectric layer such that a top surface of the first dielectric layer is exposed at the bottom of the first recess;
depositing sacrificial material within the first recess and directly on the top surface of the first dielectric layer;
forming a second interconnect layer over the first interconnect layer;
forming a second recess within the second interconnect layer that is above the first interconnect layer, wherein the second recess abuts the first recess and is conjoined with the first recess through an opening in the first recess;
removing the sacrificial material from the first recess, through the opening and the second recess;
conformally forming a layer on the walls of the first recess and the second recess; and
depositing conductive material in the first recess and the second recess that are lined with the conformal layer.

19. The method of claim 18, further comprising:
subsequent to conformally forming the layer on the walls of the first recess and the second recess, forming a seed layer on the layer on the walls, the seed layer comprises seed material for depositing the conductive material; and
depositing the conductive material by electroplating the conductive material on the seed layer.

20. The method of claim 18, wherein conformally forming the layer on the walls of the first recess and the second recess comprises:
conformally forming the layer on (i) sidewalls, top surface, and bottom surface of the first recess, and (ii) sidewalls of the second recess.

* * * * *